US007118928B2

(12) United States Patent
Steckl et al.

(10) Patent No.: US 7,118,928 B2
(45) Date of Patent: Oct. 10, 2006

(54) METHOD OF FORMING A SEMICONDUCTOR PHOSPHOR LAYER BY METALORGANIC CHEMICAL VAPOR DEPOSITION FOR USE IN LIGHT-EMITTING DEVICES

(75) Inventors: Andrew J. Steckl, Cincinnati, OH (US); Ming Pan, Cincinnati, OH (US)

(73) Assignee: University of Cincinnati, Cincinnati, OH (US)

( * ) Notice: Subject to any disclaimer, the term of this patent is extended or adjusted under 35 U.S.C. 154(b) by 311 days.

(21) Appl. No.: 10/307,715

(22) Filed: Dec. 2, 2002

(65) Prior Publication Data

US 2004/0106222 A1 Jun. 3, 2004

(51) Int. Cl.
*H01L 21/00* (2006.01)

(52) U.S. Cl. .............................. 438/22; 438/45; 438/46; 438/29

(58) Field of Classification Search ............... 438/22, 438/45–47, 29
See application file for complete search history.

(56) References Cited

U.S. PATENT DOCUMENTS

| 5,505,986 | A | * | 4/1996 | Velthaus et al. ............... 427/66 |
| 6,140,669 | A | | 10/2000 | Lozykowski et al. ......... 257/103 |
| 6,255,669 | B1 | | 7/2001 | Birkhahn et al. .............. 257/89 |
| 6,277,664 | B1 | | 8/2001 | Lozykowski et al. .......... 438/22 |
| 6,406,930 | B1 | | 6/2002 | Birkhahn et al. .............. 438/45 |
| 6,686,489 | B1 | * | 2/2004 | Celinska et al. ............... 556/28 |
| 2002/0158569 | A1 | | 10/2002 | Wakahara et al. |

2004/0262630 A1* 12/2004 Kitaoka et al. ............. 257/189

OTHER PUBLICATIONS

L.C. Chao, B.K. Lee, C.J. Chi, J. Cheng, I. Chy and A.J. Steckl, *Rare earth focused ion beam implantation utilizating Er and Pr liquid alloy ion sources*, J. Vac. Sci. Technol. B17(6), Nov./Dec. 1999, pp. 2791-2794.
K. Hara, N. Ohtake and K. Ishii, *Green Emission from Tb-Doped GaN Grown by MOVPE*, Phys. Stat. Sol. B216, 625-628 (1999).
A.J. Steckl, J. Keikenfeld and D.S. Lee, *Rare-Earth-Doped GaN Phosphors for Electroluminescent Displays*, 2001 Emissive Displays Conference/San Diego, pp. 95-98 (Nov. 2001).
J.M. Zavada, U. Hommerich and A.J. Steckl, *Light Emission from Rare Earth-Doped GaN*, in III-Nitride Semiconductors Optical Properties I, H. Jiang and M.O. Manasreh, Eds., Optoelectronic Properties of Semiconductors and Superlattices, vol. 13, Chap. 9, pp. 379-409 (2002).
Andrew J. Steckl, Jason C. Heik nfeld, Dong-Seon L e, Michael J. Garter, Christopher C. Baker, Yongqiang Wang, and Robert Jones, *Rare-Earth-Doped GaN: Growth, Properties, and Fabrication of Electroluminescent Devices*, IEEE Journal of Selected Topics in Quantum Electronics, vol. 8, No. 4, pp. 749-766 (Jul./Aug. 2002).

(Continued)

*Primary Examiner*—Chuong Anh Luu
(74) *Attorney, Agent, or Firm*—Wood, Herron & Evans, L.L.P.

(57) ABSTRACT

Light-emitting devices having a semiconductor phosphor layer formed by metalorganic chemical vapor deposition (MOCVD). The semiconductor phosphor layer may be any Group III nitride semiconductor compound that is in-situ doped during MOCVD deposition with one or more dopants effective to act as luminescent centers. The MOCVD deposition conditions required for the formation of these extrinsic luminescent films differ significantly from the MOCVD deposition conditions utilized to deposit intrinsic GaN luminescent films.

29 Claims, 3 Drawing Sheets

OTHER PUBLICATIONS

A.J. Steckl and J.M. Zavada, *Optoelectronic Properties and Applications of Rare-Earth-Doped GaN* MRS Bulletin Sep. 1999, pp. 33-38.

D.S. Lee, J. Heikenfeld, R. Birkhahn, M. Garter, B.K. Lee and A.J. Steckl,*Voltage-Controlled Yellow or Orange Emission from GaN Codoped with Er and Eu,* Applied Physics Letters, vol. 76, No. 12, pp. 1525-1527 (Mar. 20, 2000).

A.J. Steckl, J. Heikenfeld, D.S. Lee, M. Garter, *Multiple Color Capability from Rare Earth-Doped Gallium Nitride,* Materials Science and Engineering B81 (2001), pp. 97-101.

D.M. Hansen, R. Zhang, N.R. Perkins, S. Safvi, L. Zhang, K.L. Bray, T.F. Kuech, *Photoluminescence of erbium-implanted GaN and in situ-doped GaN:Er,* Appl. Phys. Letters, vol. 72, No. 10, pp. 1244-1246 (Mar. 9, 1998).

L.C. Chao and A.J. Steckl, *Room-Temperature Visible and Infrared Photoluminescence from Pr-implanted GaN Films by Focused-Ion-Beam Direct White,* Applied Physics Letters, vol. 74, No. 16, pp. 2364-2366 (Apr. 19, 1999).

J.K. Heikenfeld, M. Garter, D.S. Lee, R. Birkhahn and A.J. Steckl, *Red light emission by photoluminescence and electroluminescence from Eu-doped GaN,* Applied Physics Letters, vol. 75, No. 9, pp. 1189-1191 (Aug. 30, 1999).

A.J. Steckl and R. Birkhahn, *Visible emission from Er-doped GaN grown by solid source molecular beam epitaxy,* Appl. Phys. Letters, vol. 73, No. 12, pp. 1700-1702 (Sep. 21, 1998).

A.J. Steckl, M. Garter, D.S. Lee, J. Helkenfeld, and R. Birkhahn, *Blue emission from Tm-doped GaN electroluminescent devices,* Applied Physics Letters, vol. 75, No. 15, pp. 2184-2186 (Oct. 11, 1999).

* cited by examiner

US 7,118,928 B2

METHOD OF FORMING A SEMICONDUCTOR PHOSPHOR LAYER BY METALORGANIC CHEMICAL VAPOR DEPOSITION FOR USE IN LIGHT-EMITTING DEVICES

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Grant No. F33615-98-1-2865 awarded by The Department of the Air Force.

FIELD OF THE INVENTION

The present invention relates to light-emitting devices and, in particular, to apparatus and methods for fabricating light-emitting devices semiconductor having phosphor layers based upon Group III nitride semiconductor compounds doped with luminescent centers.

BACKGROUND OF THE INVENTION

Light-emitting devices operating by principles of electroluminescence are used in many light-emitting structures, ranging from simple panel lights to complex displays and lasers, which cover the lighting industry, computer monitors, automotive industry, television and other consumer electronics, as well as military applications. Such light-emitting devices, of which light-emitting diodes (LED's) are exemplary, are tailored to emit visible light of a given wavelength by selection of its constituent compound semiconductor. For example, aluminum gallium arsenide is used for fabricating red LED's, gallium aluminum phosphide for fabricating green LED's, and gallium nitride for fabricating blue LED's. Multi-color light-emitting structures based upon such LED's are difficult to produce by conventional methods. Specifically, such diverse compounds are difficult to combine into an integral structure. Moreover, performance characteristics, such as current and voltage requirements, differ significantly for such diverse LED's and presents a circuitry challenge in the production of multi-color light-emitting structures.

Light-emitting devices typically incorporate a semiconductor phosphor layer that provides the light emission when biased. Wide band gap semiconductors (WBGS), such as gallium nitride, doped with light-emitting elements having partially-filled inner shells, such as rare earths (RE) and transition metals, are particularly attractive materials for the fabrication of such phosphor layers. Specifically, the emission efficiency of WGBS increases with band gap value, which facilitates room temperature operation.

Gallium nitride represents one of a number of Group III nitride semiconductor compounds that possess certain advantages when compared with other WBGS. For example, gallium nitride exhibits a direct band gap transition, excellent mechanical, chemical, and thermal stabilities, and an ability to incorporate large concentrations of luminescent centers. In addition, gallium nitride has a relatively large energy band gap (approximately 3.4 eV) that permits visible light emission from higher energy transitions, while still affording a measure of control over the conductivity.

Therefore, there is a need for light-emitting devices fabricated by MOCVD in which the light-emitting element is supplied by in-situ doping and in which the visible light emission is sufficiently intense for device applications.

SUMMARY OF THE INVENTION

According the principles of the invention, a method is provided for fabricating a semiconductor phosphor layer for a light-emitting device. The method includes providing a first flow of a nitrogen-containing reactant gas, a second flow of a precursor containing a Group III element, and a third flow of a dopant precursor including at least one light-emitting element. The ratio of the molecular flow rate of the second flow of the Group III precursor relative to the first flow of nitrogen-containing reactant gas is less than 1000. The method further includes contacting the first, second and third flows with a heated substrate for depositing a semiconductor phosphor layer including a non-stoichiometric Group III nitride semiconductor compound enriched in the Group III element and the at least one light-emitting element distributed in the III-V compound semiconductor with a concentration effective to provide light emission.

The objectives and advantages of the invention will be further appreciated in light of the following detailed description and drawings in which:

DETAILED DESCRIPTION

Figure 1:
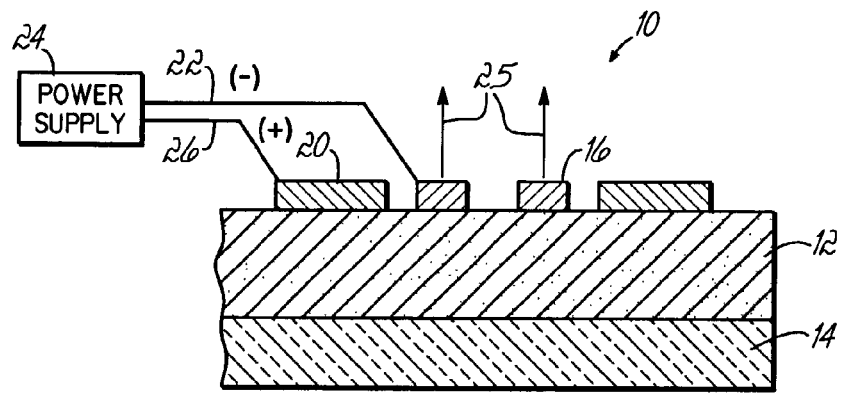
FIG. 1 is a sectional view of a light-emitting device fabricated according to the principles of the invention.

With reference to FIG. 1, a light-emitting or luminescent device 10 in accordance with the principles of the invention includes a substrate 14, a semiconductor phosphor layer 12 formed on an exposed surface of substrate 14, and a transparent ring-shaped contact or electrode 16 formed on an exposed surface of the semiconductor phosphor layer 12. The substrate 14 may be any suitable substrate material, as understood by persons of ordinary skill in the art, having a smooth, relatively flat surface finish and a relatively low defect density. Suitable substrates include, but are not limited to, sapphire, glass, silicon, gallium nitride, silicon carbide, silica, quartz, alumina, titania, and other ceramics apparent to persons of ordinary skill in the art, or one of these substrates covered by a layer of gallium nitride.

With continued reference to FIG. 1, semiconductor phosphor layer 12 is a Group III nitride semiconductor compound doped with one or more suitable impurities or dopants. The semiconductor phosphor layer 12 may be any Group III nitride semiconductor compound, including but not limited to gallium nitride (GaN), aluminum nitride (AlN), indium nitride (InN), and boron nitride (BN), capable of generating a large enough electric field strength to experience breakdown for photogenerating carriers to excite the luminescence centers provided by the dopant. In certain embodiments, the Group III nitride semiconductor compound may be an alloy of two or more Group III nitride semiconductor materials having an effective band gap large enough for visible light emission. It is appreciated that the individual semiconductor materials in the alloy may have a band gap insufficient for visible light emission and have a large enough band gap when combined for visible light emission.

Each dopant in semiconductor phosphor layer 12 may be any element having a partially filled inner transition level suitable to provide light emission, when incorporated into a Group III nitride semiconductor compound, at one or more wavelengths from among the infrared, ultraviolet and visible regions of the electromagnetic spectrum. Suitable dopants include elements selected from the Periodic Table, such as elements from the Transition metal series including chromium (Cr), copper (Cu) and manganese (Mn), and Rare Earth elements from the Lanthanide metal series including cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). The dopant concentration present in semiconductor phosphor layer 12 is effective to produce light emission. Typically, the dopant concentration ranges from about 0.1 at. % to about 10 at. %, wherein the maximum and minimum impurity concentrations are limited only by the cessation of significant light emission. Among the most common materials for forming semiconductor phosphor layer 12 are GaN, AlN, InN and alloys formed from GaN, AlN and InN or (Ga, Al, In)N doped with at least one rare-earth dopant selected from among Eu for red light emission, Er for green light emission, and Tm for blue light emission.

According to the principles of the invention, semiconductor phosphor layer 12 is formed on the substrate 14 by a method of metalorganic chemical vapor deposition (MOCVD) in which a vapor of a Group III precursor and a nitrogen-containing reactant gas are provided to the MOCVD reactor where the Group III precursor and nitrogen-containing reactant are allowed to combine and react to deposit layer 12 on substrate 14. The dopant is incorporated into the Group III nitride semiconductor compound comprising the semiconductor phosphor layer 12 during deposition by an in-situ method in which a vapor of dopant precursor containing the dopant element is present in the MOCVD reactor when the Group III precursor and nitrogen-containing reactant gas combine and react. Semiconductor phosphor layer 12 may be formed in any suitable MOCVD reactor in which the deposition is carried out for sufficient time to provide growth of layer 12 to a desired thickness, as for example, a thickness in the range of from about 0.4 µm to about 1 µm.

The molecular flow rates of the Group III precursor and the nitrogen-containing reactant gas provided to the MOCVD reactor for forming semiconductor phosphor layer 12 are controlled to provide control of the stoichiometry of semiconductor phosphor layer 12. Specifically, the ratio of the molecular flow rate of nitrogen-containing reactant gas to the molecular flow rate of the Group III precursor is less than 1000 and, typically, in the range of about 10 to about 400. Such molecular flow rates result in a Group III-rich stoichiometry for the Group III nitride semiconductor compound of semiconductor phosphor layer 12, which exhibits high quality and strong light emission from the as-grown material.

With continued reference to FIG. 1, the ring-shaped transparent electrode 16 is formed on the exposed surface of the semiconductor phosphor layer 12 by a deposition and a lift-off process. To that end, a photoresist layer (not shown) formed on the semiconductor phosphor layer 12 is exposed and developed to provide an opening suitable to create transparent electrode 16. A layer of an electrode material suitable to form the transparent electrode 16 is deposited on the patterned photoresist layer and, thereafter, the photoresist layer is removed by immersion in a solvent to lift-off the overlying electrode material leaving electrode 16. The transparent electrode 16 should have a high optical transmittance (e.g., greater than about 85%) over the whole visible light range of the electromagnetic spectrum. Indium-tin oxide is one material suitable for forming transparent electrode 16 and may be deposited by a sputter physical vapor deposition technique. The lift-off process also provides an outer contact or electrode 20 encircling the transparent electrode 16 with a generally concentric relationship. Typically, the area of the exposed surface of electrode 20 is significantly larger than the area of the exposed surface of electrode 16.

An electrical interconnect 22 electrically couples the transparent electrode 16 with a negative terminal of a direct-current (DC) voltage source or power supply 24. Another electrical interconnect 26 electrically couples the outer electrode 20 with a positive terminal of DC power supply 24. The application of a DC bias potential between electrodes 16 and 20 induces light emission from the semiconductor phosphor layer 12, which is manifested as an output beam of light, indicated diagrammatically by reference numeral 25, emitted outwardly through transparent electrode 16.

In use and with continued reference to FIG. 1, a DC bias potential is applied by the direct current power supply 24 between the transparent electrode 16 and the outer electrode 20. The application of the DC bias potential produces output beam 25 by principles of electroluminescence from the semiconductor phosphor layer 12. Output beam 25 from semiconductor phosphor layer 12 is directed outwardly from the luminescent device 10 through the transparent electrode 16. It is contemplated by the invention that an additional electrode may be incorporated between the substrate 14 and semiconductor phosphor layer 12 so that the luminescent device 10 may be provided by an alternating current (AC) voltage source.

It is appreciated that the luminescent device 10 may constitute a sub-pixel arranged among multiple luminescent devices 10 providing additional sub-pixels each emitting light of different wavelength to form a pixel in a matrix array of similar pixels forming a multi-color luminescent display. Each pixel may incorporate three sub-pixels providing respective red, green and blue light emission for forming one panel from among a matrix array of similar pixels of an RGB flat panel display. For example, the wide band-gap semiconductor GaN may be doped with an impurity concentration of Eu suitable to provide a semiconductor phosphor layer capable of emitting red light when biased, with an impurity concentration of Er suitable to provide a semiconductor phosphor layer capable of emitting green light, when biased, or with an impurity concentration of Tm suitable to provide a semiconductor phosphor layer capable of emitting blue light, when biased.

Figure 2:
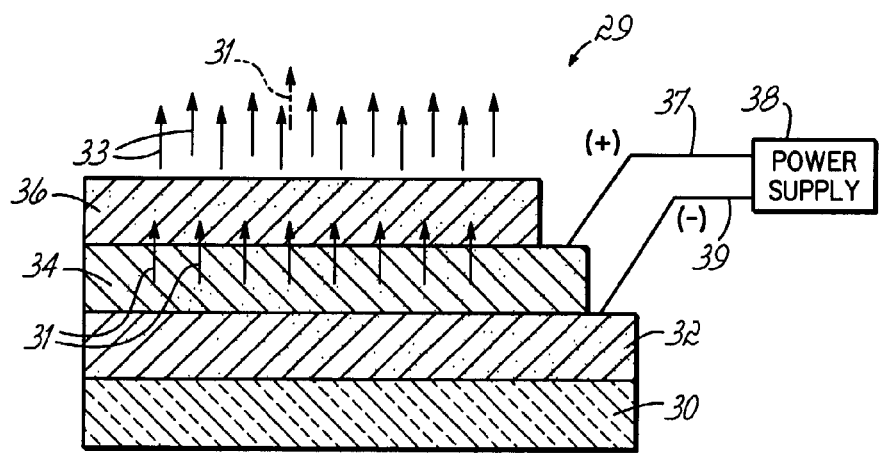
FIG. 2 is a sectional view of an alternative embodiment of a light-emitting device fabricated according to the principles of the invention.

With reference to FIG. 2, a luminescent device 29 according to the principles of the invention includes a substrate 30 similar to substrate 14 (FIG. 1), an n-type Group III nitride layer 32, a p-type Group III nitride layer 34, and a semiconductor phosphor layer 36 similar to semiconductor phosphor layer 12 (FIG. 1). The Group III nitride layers 32 and 34 may be in-situ doped during MOCVD deposition with a suitable donor element and a suitable acceptor element, respectively, so as to form a p-n junction. The Group III nitride in layers 32 and 34 may be gallium nitride, for which suitable donor elements include silicon or germanium, and suitable acceptor elements include magnesium or other Group II elements. The Group III nitride layers 32 and 34 may be deposited in the same MOCVD reactor in which the semiconductor phosphor layer 36 is deposited.

A positive terminal of a direct-current (DC) voltage source or power supply 38 is electrically coupled by an electrical interconnect 37 with the p-type Group III nitride layer 34 and a negative terminal of DC power supply 38 is electrically coupled by an electrical interconnect 39 with the n-type Group III nitride layer 32. When the DC power supply 38 is energized, the DC bias potential produces the emission of a strong intrinsic photon output, indicated diagrammatically by reference numeral 31, from the p-type Group III nitride layer 34 in which the emitted photons have a first wavelength. The photon output 31 pumps luminescent centers in the semiconductor phosphor layer 36, which in turn, due to extrinsic photoluminescence, emits an output beam of visible light, indicated diagrammatically by reference numeral 33, at a different wavelength than photon output 31. The n-type Group III nitride layer 32, p-type Group III nitride layer 34, and semiconductor phosphor layer 36 may be GaN alloyed with AlN and/or InN, such that the photon output 31 is absorbed, or at least partially absorbed, by the semiconductor phosphor layer 36. The invention contemplates at least a portion of the photon output 31 may pass through the semiconductor phosphor layer 36, as indicated in phantom in FIG. 2. Different visible emissions may be produced from semiconductor phosphor layer 36 by incorporating different dopants, for example, red emission from Eu, green emission from Er, and blue from Tm. Multi-color emission may be obtained from semiconductor phosphor layer 36 by the incorporation of more than one dopant.

Figure 3:
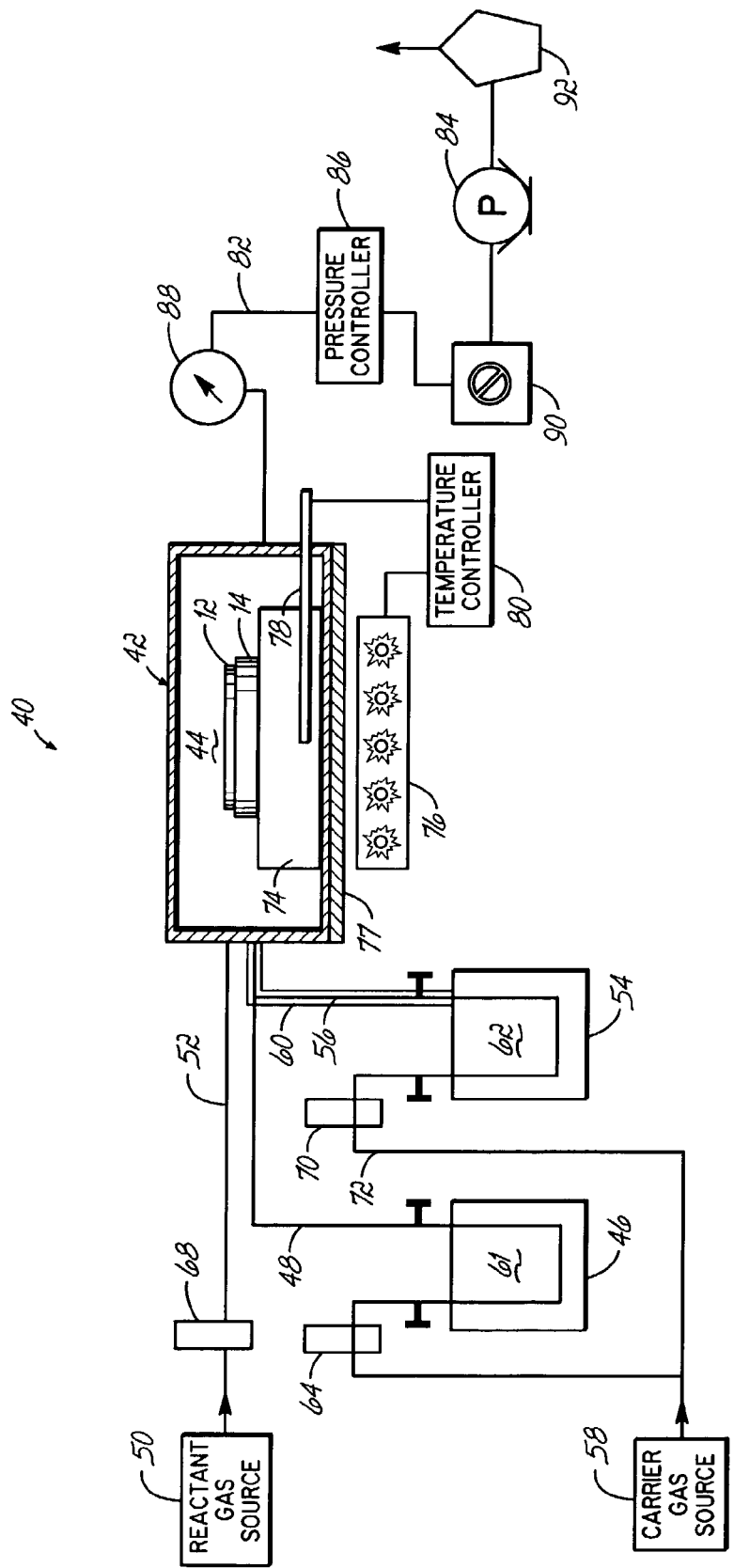
FIG. 3 is a diagrammatic view of an MOCVD system suitable for fabricating semiconductor phosphor layers according to the principles of the invention.

With reference to FIG. 3, an MOCVD system or reactor, generally indicated by reference numeral 40, suitable for forming semiconductor layer 12 by an MOCVD process with in-situ doping is depicted. The MOCVD reactor 40 may be any suitable MOCVD reactor, including but not limited to a hot wall type having a horizontal geometry, a hot wall type having a vertical geometry, a cold wall type having a horizontal geometry, and a cold wall type having a vertical geometry. The MOCVD reactor 40 generally includes a reaction chamber 42 enclosing a deposition zone 44, a Group III precursor source 46 coupled with the reaction chamber 42 by a transport line 48, a reactant gas source 50 coupled with the reaction chamber 42 by a transport line 52, and a dopant precursor source 54 coupled with the reaction chamber 42 by a transport line 56. The Group III and dopant precursor sources 46, 54 are each charged with an amount of a suitable precursor and are capable of being individually heated or cooled to respective temperatures at which the precursor develops an appreciable vapor pressure to allow transport to the reaction chamber 42. The use of distinct transport lines 52, 56 ensures that the vaporized Group III precursor and the reactant gas are transported separately into the reaction chamber 42. The dopant precursor source 54 is directly connected to reaction chamber 42 to provide a transfer path free of a pressure barrier, which maximizes the transport of the dopant precursor.

A regulated flow of carrier gas from a carrier gas source 58 is provided individually to each of the precursor sources 46, 54. The carrier gas may be any gas that is substantially non-reactive with the precursor vapors, such as hydrogen, argon, and helium. The respective flows of carrier gas function to entrain and mix with the corresponding vapors of the precursors held by precursor sources 46, 54 to provide gas mixtures transported through the corresponding one of the transport lines 52, 56 to the reaction chamber 42. Transport line 56 is wrapped with heating tape 60 that heats line 56 to a uniform temperature. Generally, heating tape 60 heats transport line 56 to a temperature ranging from about 5° C. to about 10° C. above the temperature of the precursor material held by the dopant precursor source 54. This temperature differential prevents condensation of the dopant precursor vapors in transport line 56. The precursors transported from precursor sources 46, 54 react in the reaction chamber 42 with the reactant gas arriving from reactant gas source 50 to deposit semiconductor phosphor layer 12 as a reaction product on a substrate 14.

With continued reference to FIG. 3, the amount of vaporized Group III precursor transported from the Group III precursor source 46 to the reaction chamber 42 is controlled by the temperature of precursor source 46, which varies the vapor pressure, and by the flow rate of the carrier gas transported through a reservoir 61 holding the Group III precursor. Similarly, the amount of vaporized dopant precursor transported from the dopant precursor source 54 to the reaction chamber 42 is controlled by the temperature of precursor source 54 and by the flow rate of the carrier gas bubbled through a reservoir 62 holding the dopant precursor. The dopant precursor source 54 and the precursor held thereby is heated to a temperature between about 75° C. and the melting point of the precursor to avoid a disruptive change in the vapor pressure. Similarly, the amount of reactant gas supplied from the reactant gas source 50 to the reaction chamber 42 is precisely controlled by regulating the flow rate. It is contemplated by the invention that a plasma may be generated in deposition zone 44, as understood by persons of ordinary skill in the art, to provide a plasma-assisted MOCVD process.

The flow rate of carrier gas and the flow rate of reactant gas are precisely regulated and metered for controlling and tailoring the properties of the semiconductor phosphor layer 12 deposited on substrate 14. To that end, a mass flow controller 64 is disposed in an inlet line 66 that conveys carrier gas from the carrier gas source 58 to the Group III precursor source 46. Similarly, a mass flow controller 68 is disposed in the transport line 52 coupling the reactant gas source 50 with the reaction chamber 42. A mass flow controller 70 is also disposed in an inlet line 72 that conveys carrier gas from the carrier gas source 58 to the dopant precursor source 54. The mass flow controllers 64, 68, 70 permit precision control of the corresponding molecular flow rates of Group III precursor, dopant precursor, and nitrogen-containing reactant gas introduced into the reaction chamber 42 and directed over substrate 14. The mass flow controllers 64, 68, 70 also permit direct determinations or measurement of the corresponding flow rates, which may be used to quantify a V/III ratio representative of the molecular flow rate of the nitrogen-containing reactant gas to the molecular flow rate of the Group III precursor.

The Group-III precursor and the reactant gas combine and react in the reaction chamber 42 at a suitable V/III molecular flow ratio to form a semiconductor phosphor layer 12 capable of producing perceptible light emission when electrically biased. The ratio of the molecular flow rates of reactant gas and Group III precursor provided to the reaction chamber 42 for forming semiconductor phosphor layer 12 is less than 1000 and, typically, in the range of about 10 to about 400. Such V/III molecular flow rates result in a stoichiometry enriched in the Group III element for semiconductor phosphor layer 12, which exhibits high film quality and strong light emission from the as-deposited layer 12.

With continued reference to FIG. 3, the substrate 14 is mounted to a susceptor 74 situated within the deposition zone 44 of the reactor chamber 42. The susceptor 74 and substrate 14 are heated by a bank of infrared lamps 76 located outside of the reaction chamber 42 and partitioned from the deposition zone 44 by an infrared-transmissive wall 77 of reaction chamber 42. The infrared lamps 76 heat the susceptor 74 and substrate 14 to a deposition temperature adequate for formation of semiconductor phosphor layer 12. Susceptor 74 may alternatively be heated by any other suitable heat transfer or heat exchange arrangement, such as by resistively or inductively-coupled heating, in which substrate 14 is maintained at a temperature effective for promoting deposition of semiconductor phosphor layer 12 on substrate 14. The deposition temperature may be in the range of from about 400° C. to about 1200° C., typically about 1000° C. to about 1050° C. and, more typically, is about 1025° C.

The temperature of the susceptor 74 is sensed by an embedded thermocouple 78. A temperature controller 80 receives the temperature information from the thermocouple 78. The temperature controller 80 uses the temperature information for regulating the output of the infrared lamps 76 so as to provide a susceptor temperature and substrate temperature adequate for performing the deposition of semiconductor phosphor layer 12.

With continued reference to FIG. 3, the reaction chamber 42 is coupled by an exhaust line 82 with a vacuum pump 84. The vacuum pump 84 evacuates excess precursor vapors, reactant and carrier gases, and gaseous reaction waste products from the deposition zone 44 of the reaction chamber 42 and maintains the reaction chamber 42 at a reduced pressure during deposition of semiconductor phosphor layer 12. Typically, the pressure in the reaction chamber 42 is maintained between about 30 mbar and about 70 mbar, as pressures in this range are believed to assist the vaporization of the dopant precursor in dopant precursor source 54. A pressure controller 86, a pressure gauge 88, and a throttle valve 90 disposed in the exhaust line 82 cooperate for regulating the pressure in the reaction chamber 42. The exhaust of the vacuum pump 84 is directed through a scrubber 92 that removes noxious waste gases from the stream of gases received from the deposition zone 44.

Precursors suitable for supplying a rare earth precursor from dopant precursor source 54 and a Group III precursor from Group III precursor source 46 include any organic compound sufficiently volatile to permit gas phase transport into the reaction chamber 42. One suitable family of organic compounds suitable for the dopant precursor are the rare earth beta-diketonates, which may be heated in the dopant precursor source 54 to a temperature sufficient to provide adequate vaporization. Typically, adequate vaporization results from heating the rare earth beta-diketonates to a temperature between about 75° C. and a temperature just below the melting point of the precursor. Organic compounds suitable as a source for supplying gallium as a Group III precursor include, but are not limited to, trimethylgallium (TMGa) and triethylgallium (TEGa). Similarly, organic compounds suitable as a source for supplying aluminum as a Group III precursor include, but are not limited to, trimethylaluminum (TMAl) and triethylaluminum (TEAl). One organic compound suitable as a source for supplying indium as a Group III precursor is trimethylindium (TMIn). The reactant gas is a nitrogenous or nitrogen-containing gas or vapor including, but not limited to, nitrogen ($N_2$) and ammonia ($NH_3$). Typical flow rates for the various gases are 3500 sccm to 5000 sccm for the carrier gas, $2 \times 10^{-3}$ mol/min to $7 \times 10^{-2}$ mol/min for the nitrogen-containing reactant gas, 80 μmol/min to 100 μmol/min for the Group III precursor, and the carrier gas flow rate for the dopant precursor ranges from about 300 sccm to about 500 sccm. Carrier gas flow rates near 500 sccm are believed to enhance the transport of the dopant precursor to the reaction chamber 42.

The invention will be further appreciated in light of the following examples and comparative examples.

EXAMPLE 1

A europium-doped GaN (GaN:Eu) film was grown in an MOCVD reaction chamber on a GaN layer formed on an $Al_2O_3$ substrate. Trimethylgallium and ammonia were employed as the sources of gallium precursor and nitrogen-containing reactant gas, respectively, supplied to the MOCVD reaction chamber. Europium was supplied to the MOCVD reaction chamber using a precursor of europium beta-diketonate (europium 2,2,4,4-tetramethyl-3,5-heptanedionate, (Eu(thd)3)). The deposition procedure consists of three steps: a first undoped GaN layer deposition, Eu-doped GaN layer deposition, and a second undoped GaN growth creating a capping layer. The substrate was heated to about 1025° C. during the deposition of the doped and undoped GaN layers. The pressure in the reaction chamber was controlled at about 50 mbar. The Eu(thd)3 precursor source was heated to about 135° C. and the dopant line temperature was heated to about 140° C. to prevent the vaporized Eu precursor from condensing during transport. The TMGa and $NH_3$ flow rates were controlled at 92 mmol/min and $2.68 \times 10^{-3}$ mol/min, respectively. This results in V/III molecular flow ratio of 29, which represents a significantly Ga-rich growth condition. The flow rate of carrier gas $H_2$ for Eu(thd)3 was set at 500 sccm. A deposition time of about 20 min yielded a GaN:Eu film having a thickness of about 0.7 mm.

Figure 4:
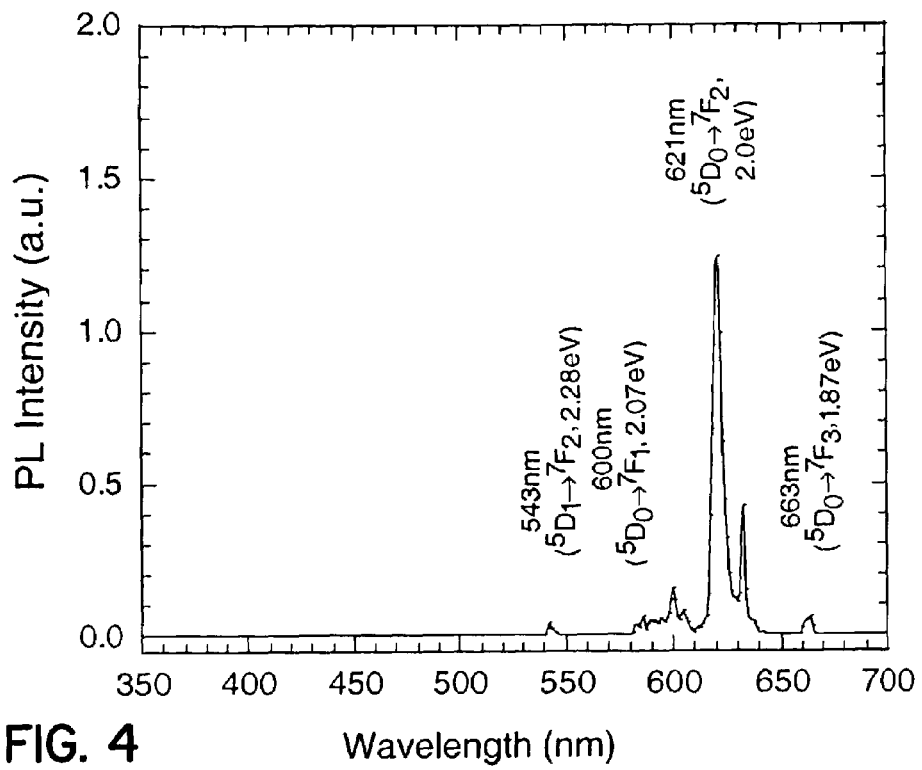
FIG. 4 is a graphical representation of a photoluminescence spectrum of light output from an Eu-doped GaN film formed on an undoped GaN layer covering a sapphire substrate.

With reference to FIG. 4, a room-temperature spectrum resulting from photoluminescence measurements made on the GaN:Eu film is graphically displayed. The spectrum originating from the GaN:Eu film was detected by using a HeCd laser with a 325 nm wavelength to optically pump the sample. Strong emission appears at a wavelength of 621 nm, arising from the Eu inner shell energy transition from $^5D_0$ (2.14 eV) to $^7F_2$ (0.14 eV). Additional satellite photoluminescence peaks apparent at 543 nm, 600 nm and 663 nm correspond to Eu energy transitions from $^5D_1$ (2.35 eV) to $^7F_2$ (0.07 eV), from $^5D_0$ (2.14 eV) to $^7F_1$ (0.07 eV) and from $^5D_0$ (2.14 eV) to $^7F_3$ (0.27 eV), respectively. The intrinsic GaN band-edge emission at 365 nm was observed to be several orders of magnitude smaller than the Eu-based emission and is not discernible in the spectrum at this vertical scale.

EXAMPLE 2

A series of europium-doped GaN films were grown by the method of Example 1 in which the V/III molecular flow ratio was varied from 29 to 1000. A room-temperature photoluminescence spectrum, similar to FIG. 4, was acquired for each of the GaN:Eu films. The intensity of the visible Eu photoluminescence emission and the intensity of the GaN band-edge ultraviolet emission were measured from each photoluminescence spectrum and are graphically presented in FIG. 5.

Figure 5:
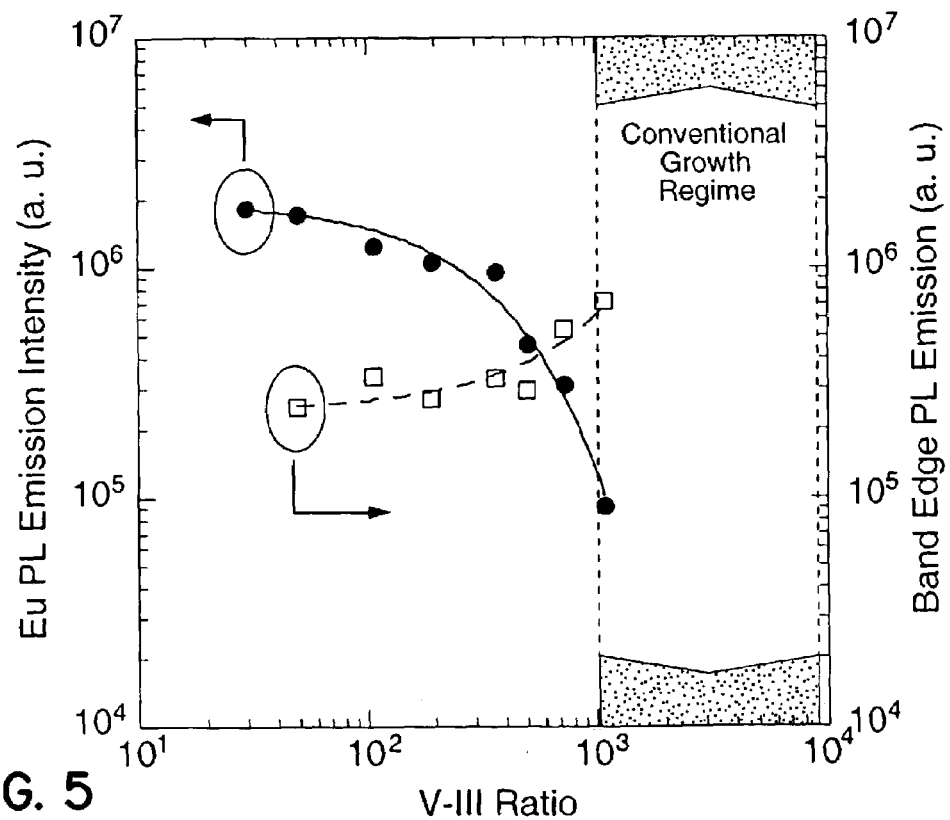
FIG. 5 is a graphical representation of the visible Eu-based photoluminescence intensity and GaN band-edge ultraviolet emission from GaN:Eu semiconductor phosphor layers, in which each semiconductor phosphor layer was formed with various different V-III molecular flow rate ratios.

It is apparent from FIG. 5 that the intensity of the visible Eu photoluminescent emission increased with decreasing V/III molecular flow ratio. In particular, the intensity of the visible Eu photoluminescence emission increased by over an order of magnitude as the V/III molecular flow ratio decreases from 1000 to 29. It is also apparent from FIG. 5 that the intensity of the GaN band-edge ultraviolet emission increases with increasing V/III molecular flow ratio. The dopant-based ("extrinsic") GaN luminescence is fundamentally different in nature from band-to-band ("intrinsic") GaN luminescence. These trends are expected to continue into the conventional growth regime having a V/III molecular flow ratio greater than 1000. Specifically, the intensity of the Eu photoluminescence emission will further decrease, and the intensity of the GaN band-edge ultraviolet emission will further increase as the V/III molecular flow ratio increases from 1000 to 8000.

EXAMPLE 3

An electroluminescent light-emitting device was fabricated from a GaN:Eu film grown as in Example 1 other than having a V-III ratio of 364. A transparent and conducting electrode material of indium-tin oxide (ITO) was deposited by rf-sputtering onto the GaN:Eu film. The ITO sputtering target had a composition of 90% $In_2O_3$ and 10% $SnO_2$. A deposition rate of about 9 nm/min was obtained by sputtering at a pressure of 3.3 mTorr with 150 W of radio-frequency power, which resulted in a direct current bias of −320 V. The ITO film was about 400 nm thick. The ITO electrode material was patterned utilizing a liftoff process to provide a pair of ring electrodes. The width of the device ring was 75 μm. After the liftoff process, the structure was annealed in $N_2$ at 450° C. for 30 min.

Figure 6:
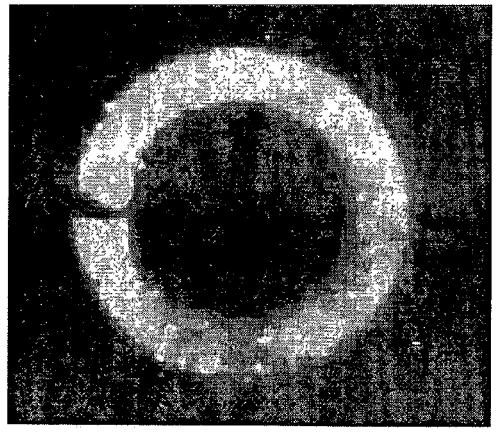
FIG. 6 is an image of light emission from an electroluminescent light-emitting device incorporating an Eu-doped GaN film.

With reference to FIG. 6, a DC bias voltage of about 20 V was applied to the ring electrodes, which induced light emission from the GaN:Eu film. Specifically, light was emitted from portions of the GaN:Eu film underlying the innermost electrode of the two ring electrodes. The electroluminescent light emission was observed to be in the red wavelength region of the electromagnetic spectrum and was measured to be centered about a wavelength of 621 nm.

While the invention has been illustrated by the description of various embodiments thereof, and while the embodiments have been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of Applicants' general inventive concept.

What is claimed is:

1. A method of fabricating a semiconductor phosphor layer for a light-emitting device, comprising:
    providing a first flow of a nitrogen-containing reactant gas;
    providing a second flow of a precursor including a Group III element, said second flow having a ratio of molecular flow rate relative to the first flow of nitrogen-containing reactant gas of less than 1000;
    providing a third flow of a dopant precursor including at least one light-emitting element; and
    contacting the first, second and third flows with a heated substrate for depositing a semiconductor phosphor layer, the semiconductor phosphor layer including a non-stoichiometric Group III nitride semiconductor compound enriched in the Group III element and the at least one light-emitting element distributed in the compound semiconductor with a concentration effective to provide light emission.

2. The method of claim 1 wherein the at least one light-emitting element is selected from the group consisting of elements from the Lanthanide Series of the Periodic Table and elements from the Transition Metal Series of the Periodic Table.

3. The method of claim 1 wherein the Group III nitride semiconductor compound is gallium nitride and the at least one light-emitting element is selected from the group consisting of cerium, praseodymium, neodymium, samarium, europium, gadolinium, terbium, dysprosium, holmium, erbium, thulium, and ytterbium.

4. The method of claim 1 wherein the Group III nitride semiconductccr compound is selected from the group consisting of gallium nitride, aluminum nitride, and indium nitride.

5. The method of claim 1 wherein the Group III nitride semiconductor compound is an alloy having an effective band-gap sufficient for visible light emission.

6. The method of claim 1 further comprising:
    forming an optically-transmissive electrode on said semiconductor phosphor layer, the electrode configured to receive a bias potential effective to produce light emission from said light-emitting element of said semiconductor phosphor layer.

7. The method of claim 6 wherein the electrode is configured to receive a direct current bias potential.

8. The method of claim 6 wherein the electrode is configured to receive an alternating current bias potential.

9. The method of claim 1 further comprising generating a plasma from the nitrogen-containing reactant gas and contacting the plasma with the heated substrate.

10. The method of claim 1 wherein the dopant precursor is an organic compound containing at least one rare earth element, and the method further comprises:
    heating the organic compound to a first temperature between about 75° C. and a melting point of the organic compound to provide a vapor.

11. The method of claim 10 wherein the organic compound is a rare earth beta-diketonate.

12. The method of claim 10 further comprising:
    heating a transport line directing the vapor to a second temperature ranging from about 5° C. to about 10° C. higher than the first temperature.

13. The method of claim 1 wherein the concentration of the at least one light-emitting element ranges from about 0.1 at. % to about 10 at. %.

14. The method of claim 1 wherein the at least one light-emitting element has an electronic structure suitable for light emission in at least one of the infrared region of the electromagnetic spectrum, the visible region of the electromagnetic spectrum, and the ultraviolet region of the electromagnetic spectrum.

15. The method of claim 1 wherein the Group III precursor is selected from the group consisting of trimethylgallium, triethylgallium, trimethylaluminum, triethylaluminum, and trimethylindium.

16. The method of claim 1 wherein the Group III precursor and the nitrogen-containing reactant gas are transported by separate fluid pathways into the reaction chamber.

17. The method of claim 1 further comprising:
heating the substrate to a temperature sufficient to promote deposition of the semiconductor phosphor layer.

18. The method of claim 17 wherein the temperature ranges from about 1000° C. to about 1050° C.

19. The method of claim 1 wherein the dopant precursor includes a plurality of light-emitting elements each capable of emitting light at a different wavelength.

20. The method of claim 1 further comprising repeating the steps of providing the first flow of the nitrogen-containing reactant gas, providing the second flow of the Group III precursor compound, providing the third flow of the dopant precursor, and contacting the first, second and third flows with the heated substrate for depositing a plurality of semiconductor phosphor layers each including a non-stoichiometric Group III nitride semiconductor compound enriched in the Group III element and a different light-emitting element distributed in the Group III nitride semiconductor compound with a concentration effective to provide light emission at different colors among one another that are effective for fabricating a multiple color light-emitting structure.

21. The method of claim 20 wherein the multiple color light-emitting structure is capable of emitting light at wavelengths corresponding to the primary colors.

22. The method of claim 1 further comprising:
placing the substrate in a MOCVD system selected from the group consisting of a hot wall type having a horizontal geometry, a hot wall type having a vertical geometry, a cold wall type having a horizontal geometry, and a cold wall type having a vertical geometry, the MOCVD system configured to receive the first, second and third flows.

23. The method of claim 1 wherein the nitrogen-containing reactant gas is $NH_3$.

24. The method of claim 1 wherein the molecular flow rate ratio of the second flow of the Group III precursor compound to the first flow of nitrogen-containing reactant gas is between about 10 and about 400.

25. The method of claim 19 wherein the Group III nitride semiconductor compound is gallium nitride and each of the plurality of light-emitting elements is selected from the group consisting of cerium, praseodymium, neodymium, samarium, europium, gadolinium, terbium, dysprosium, holmium, erbium, thulium, and ytterbium.

26. The method of claim 1 wherein the heated substrate includes an n-type Group III nitride layer on the substrate and a p-type Group III nitride layer on the n-type Group III nitride layer, and contacting the first, second and third flows with the heated substrate for depositing the semiconductor phosphor layer further comprises:
forming the semiconductor phosphor layer on the p-type Group III nitride layer.

27. The method of claim 26 wherein the n-type Group III nitride layer is gallium nitride doped with a donor element selected from the group consisting of silicon and germanium and the p-type Group III nitride layer is gallium nitride doped with an acceptor element selected from the group consisting of elements from Group II of the Periodic Table.

28. The method of claim 26 wherein the n-type Group III nitride layer and the p-type Group III nitride layer define a p-n junction capable of emitting a first photon output having a first wavelength when a bias potential is applied.

29. The method of claim 26 wherein the at least one light-emitting element distributed in the compound semiconductor of the semiconductor phosphor layer is effective to absorb at least a portion of the first photon output and to emit a second photon output at a second wavelength that differs from the first wavelength.

* * * * *

UNITED STATES PATENT AND TRADEMARK OFFICE
CERTIFICATE OF CORRECTION

PATENT NO. : 7,118,928 B2 Page 1 of 1
APPLICATION NO. : 10/307715
DATED : October 10, 2006
INVENTOR(S) : Steckl et al.

It is certified that error appears in the above-identified patent and that said Letters Patent is hereby corrected as shown below:

Title Page, Item (57) References, Other Publications
Page 2, line 12, change "Helkenfeld" to --Heikenfeld--.

Column 8:
Line 56, change "7 F2" to --7F2--.

Signed and Sealed this

Sixth Day of February, 2007

JON W. DUDAS
*Director of the United States Patent and Trademark Office*